(12) United States Patent
Brandes et al.

(10) Patent No.: US 8,378,463 B2
(45) Date of Patent: *Feb. 19, 2013

(54) ORIENTATION OF ELECTRONIC DEVICES ON MIS-CUT SUBSTRATES

(75) Inventors: George R. Brandes, Raleigh, NC (US); Robert P. Vaudo, Cary, NC (US); Xueping Xu, Stamford, CT (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/974,332

(22) Filed: Dec. 21, 2010

(65) Prior Publication Data

US 2011/0089536 A1     Apr. 21, 2011

Related U.S. Application Data

(63) Continuation of application No. 11/994,406, filed as application No. PCT/US2006/024846 on Jun. 27, 2006, now Pat. No. 7,884,447.

(60) Provisional application No. 60/699,659, filed on Jul. 11, 2005.

(51) Int. Cl.
*H01L 29/04* (2006.01)

(52) U.S. Cl. ... 257/627; 257/628; 257/615; 257/E31.04; 438/973; 372/44.011; 372/45.01

(58) Field of Classification Search ............ 257/627, 257/628, 615, E31.04; 438/973; 372/44.011, 372/45.01
See application file for complete search history.

(56) References Cited

U.S. PATENT DOCUMENTS

| | | | |
|---|---|---|---|
| 5,313,078 A | 5/1994 | Fujii et al. | |
| 5,637,531 A | 6/1997 | Porowski et al. | |
| 6,072,197 A | 6/2000 | Horino et al. | |
| 6,447,604 B1 | 9/2002 | Flynn et al. | |
| 6,455,877 B1 | 9/2002 | Ogawa et al. | |
| 6,596,079 B1 | 7/2003 | Vaudo et al. | |
| 7,064,357 B2 | 6/2006 | Ueta et al. | |
| 7,118,813 B2 | 10/2006 | Xu et al. | |

(Continued)

FOREIGN PATENT DOCUMENTS

| | | |
|---|---|---|
| EP | 1182697 A2 | 2/2002 |
| JP | 11-191657 A | 7/1999 |

(Continued)

OTHER PUBLICATIONS

Bockowski, M., et al., "Directional crystallization of GaN on high-pressure solution grown substrates by growth from solution and HVPE", "J. Cryst. Growth", Dec. 2002, pp. 194-206, vol. 246, No. 3-4.

(Continued)

*Primary Examiner* — Tu-Tu Ho
(74) *Attorney, Agent, or Firm* — Hultquist, PLLC; Steven J. Hultquist; Frank J. Bozzo

(57) ABSTRACT

A microelectronic assembly in which a semiconductor device structure is directionally positioned on an off-axis substrate. In an illustrative implementation, a laser diode is oriented on a GaN substrate wherein the GaN substrate includes a GaN (0001) surface off-cut from the <0001>direction predominantly towards either the <11$\bar{2}$0> or the <1$\bar{1}$00> family of directions. For a <11$\bar{2}$0> off-cut substrate, a laser diode cavity may be oriented along the <1$\bar{1}$00> direction parallel to lattice surface steps of the substrate in order to have a cleaved laser facet that is orthogonal to the surface lattice steps. For a <1$\bar{1}$00> off-cut substrate, the laser diode cavity may be oriented along the <1$\bar{1}$00> direction orthogonal to lattice surface steps of the substrate in order to provide a cleaved laser facet that is aligned with the surface lattice steps.

29 Claims, 3 Drawing Sheets

U.S. PATENT DOCUMENTS

| | | |
|---|---|---|
| 7,253,499 B2 | 8/2007 | Shibata |
| 7,390,581 B2 | 6/2008 | Xu et al. |
| 7,884,447 B2 * | 2/2011 | Brandes et al. ............... 257/627 |
| 2001/0030329 A1 | 10/2001 | Ueta et al. |
| 2002/0048964 A1 | 4/2002 | Yuasa et al. |
| 2002/0142503 A1 | 10/2002 | Miyachi et al. |
| 2003/0121511 A1 * | 7/2003 | Hashimura et al. ............... 125/2 |
| 2003/0145783 A1 | 8/2003 | Motoki et al. |
| 2003/0209185 A1 | 11/2003 | Ueno et al. |
| 2003/0213964 A1 | 11/2003 | Flynn et al. |
| 2004/0196877 A1 * | 10/2004 | Kawakami et al. ............. 372/23 |
| 2004/0238810 A1 | 12/2004 | Dwilinski et al. |
| 2004/0251471 A1 | 12/2004 | Dwilinski et al. |
| 2005/0104162 A1 | 5/2005 | Xu et al. |
| 2008/0199649 A1 | 8/2008 | Xu et al. |
| 2008/0265379 A1 | 10/2008 | Brandes et al. |
| 2010/0148320 A1 | 6/2010 | Xu et al. |

FOREIGN PATENT DOCUMENTS

| | | |
|---|---|---|
| JP | 2000-156348 A | 6/2000 |
| JP | 2000-223743 A | 8/2000 |
| JP | 2001-160539 A | 6/2001 |
| JP | 2001-230497 A | 8/2001 |
| JP | 2002-016000 A | 1/2002 |
| JP | 2003-060318 A | 2/2003 |
| JP | 2003-238297 A1 | 8/2003 |
| JP | 2005-150287 A | 6/2005 |
| WO | 0201608 A2 | 1/2002 |
| WO | 03043150 A1 | 5/2003 |
| WO | 2005050707 A2 | 6/2005 |
| WO | 2005050709 A2 | 6/2005 |

OTHER PUBLICATIONS

Frayssinet, E., et al., "High electron mobility in AlGaN/GaN heterostructures grown on bulk GaN substrates", "Appl. Phys. Letters", Oct. 16, 2000, pp. 2551-2553, vol. 77, No. 16.

Kamp, M., et al., "GaN Homoepitaxy for Device Applications", "MRS Internet J. Nitride Semicond. Res.", 1999, pp. G.10.2, vol. 4S1.

Zauner, A.R.A., et al., "Homo-epitaxial GaN growth on exact and misoriented single crystals: suppression of hillock formation", "J. Cryst. Growth", Mar. 2000, pp. 435-443, vol. 210, No. 4.

Motoki, Kensaku, et al., "Preparation of Large Freestanding GaN Substrates by Hydride Vapor Phase Epitaxy Using GaAs as a Starting Substrate", "Jpn. J. Appl. Phys.", 2001, pp. L140-L143, vol. 40.

Nakamura, Shuji, et al., "High-Power, Long-Lifetime InGaN/GaN/AlGaN-Based Laser Diodes Grown on Pure GaN Substrates", "Jpn. J. Appl. Phys.", Mar. 15, 1998, pp. L309-L312, vol. 37, No. Pt. 2, No. 3B.

Ponce, F.A., et al., "Spatial distribution of the luminescence in GaN thin films", "Appl. Phys. Letters", Jan. 1, 1996, pp. 57-59, vol. 68, No. 1.

Porowski, S., et al., "Thermodynamical properties of III-V nitrides and crystal growth of GaN at high N2 pressure", "J. Cryst. Growth", Jun. 2, 1997, pp. 174-188, vol. 178, No. 1-2.

* cited by examiner

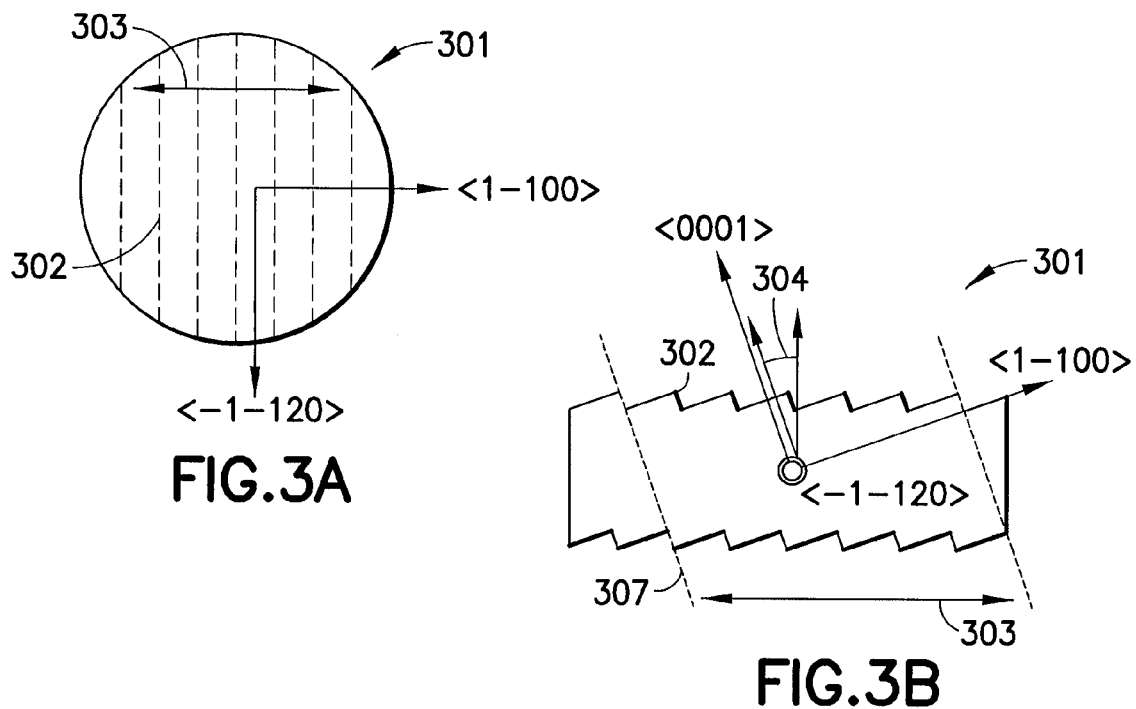
FIG.3A
FIG.3B
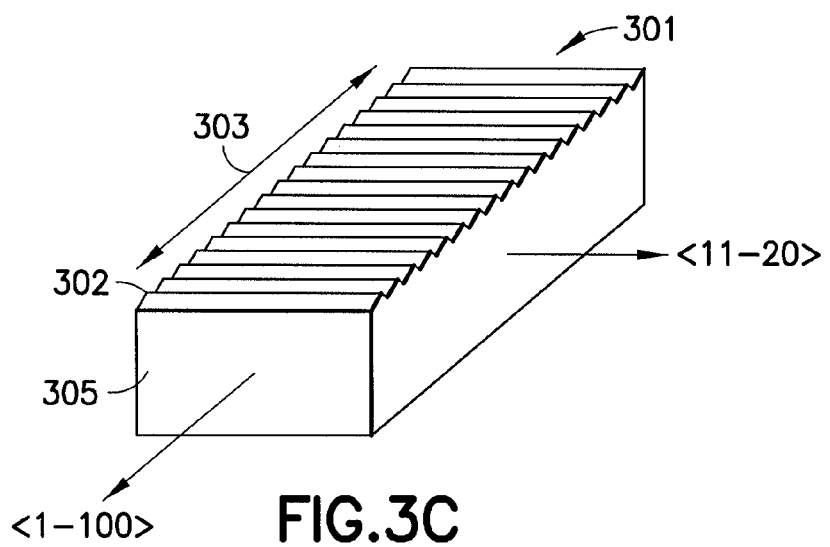
FIG.3C
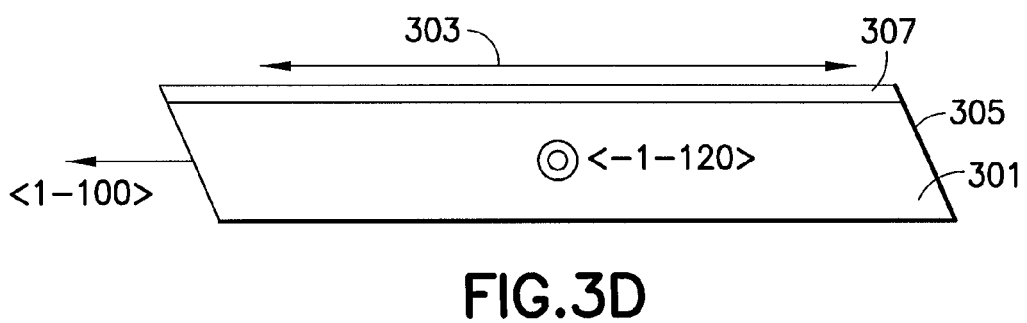
FIG.3D

ORIENTATION OF ELECTRONIC DEVICES ON MIS-CUT SUBSTRATES

CROSS-REFERENCE TO RELATED APPLICATIONS

This is a continuation of U.S. patent application Ser. No. 11/994,406 filed Dec. 31, 2007, issued on Feb. 8, 2011 as U.S. Pat. No. 7,884,447, which was filed under the provisions of 35 U.S.C. §371 claiming benefit of International Patent Application No. PCT/US06/24846 filed Jun. 27, 2006, and U.S. Provisional Patent Application No. 60/699,659, filed Jul. 11, 2005. The disclosures of the foregoing applications are hereby incorporated herein by reference in their respective entireties, for all purposes, and the priority of all such applications is hereby claimed under the provisions of 35 U.S.C. §120.

TECHNICAL FIELD

The present invention relates generally to semiconductor devices and in a particular aspect to the directional placement of a laser diode on an off-axis substrate of a III-V nitride material such as gallium nitride.

BACKGROUND

Gallium nitride (GaN) and related III-V nitride alloys are wide bandgap semiconductor materials that have applications in opto-electronics (e.g., in fabrication of blue and UV light emitting diodes and laser diodes) and in high-frequency, high-temperature and high-power electronics. In such high-performance devices, high quality epitaxial films must be grown on the substrate.

Gallium nitride-based electronic devices are typically grown on foreign (heteroepitaxial) substrates such as sapphire and silicon carbide. Due to the resultant mismatch of lattice constants and thermal expansion differences between the gallium nitride device layers and the foreign substrate, a high density of defects typically is produced in the gallium nitride device layers, which in turn adversely affects device performance.

Growth of gallium nitride device layers is typically performed by metal-organic chemical vapor deposition (MOCVD) or metal-organic vapor phase epitaxy (MOVPE), with a buffer layer first being grown on the foreign substrate, followed by growth of a few microns thickness of gallium nitride and associated device layers. To reduce crystal defects in the gallium nitride layer, techniques such as epitaxially laterally overgrown (ELOG) growth have been employed on sapphire or silicon carbide.

In view of the morphological and structural deficiencies associated with use of heteroepitaxial substrates, native gallium nitride substrates would be ideal for many gallium-nitride based microelectronic devices. Gallium nitride substrates can be prepared by various methods.

Porowski et al. U.S. Pat. No. 5,637,531 describes growth of bulk gallium nitride from metallic gallium at high nitrogen pressure, but the disclosed method has achieved maximum crystal size of only about 10 mm platelets (S. Porowski and I. Grzegory, J. Cryst. Growth, vol. 178, 174 (1997), M. Bockowski, J. Cryst. Growth, vol. 246, 194 (2002)). Gallium nitride crystalline platelets are c-plane structures and have polar surfaces, with one face of the platelet terminated with gallium and the other face terminated with nitrogen. Each of the respective surfaces has distinct properties, and most gallium nitride-based devices are as a matter of preference grown on the gallium-terminated surface, i.e., the (0001) surface. Although the size of the crystal platelets is small, homoepitaxial growth has been carried out on samples of such platelets. For example, MOVPE homoepitaxy has been carried out on gallium nitride crystalline platelets with lateral dimensions of less than 5 mm (F. A. Ponce, D. P. Bour, W. Götz and P. J. Wright, Appl. Phys. Lett., 68(1), 57 (1996)). High electron mobility transistor (HEMT) structures based on AlGaN/GaN heterostructures have been grown on 8×8 $mm^2$ gallium nitride samples by molecular beam epitaxy (E. Frayssington et al., Appl. Phys. Lett. 77, 2551 (2000)). InGaN/GaN multiple quantum well (MQW) structures and double heterostructure LEDs have been grown on approximately 6×8 $mm^2$ gallium nitride samples by MOVPE (M. Kamp et al., MRS Internet J. Nitride Semicond. Res. 4S1, G.10.2 (1999)). MOVPE homoepitaxial growth on nitrogen-terminated gallium nitride (000$\bar{1}$) crystal platelets and on surfaces slightly tilted away from the (000$\bar{1}$) plane has been reported (A. R. A. Zauner et al., J. Crystal Growth, 210, 435 (2000)).

Since the manufacture of opto-electronic and electronic devices requires large area substrates, various devices have been grown on large-area gallium nitride substrates produced by other techniques. In one such technique, gallium nitride-based laser diodes have been fabricated (S. Nakamura, et al., Jpn. J. Appl. Phys. 37, L309 (1998)) by a complicated growth sequence. First, a 2 micron thick MOVPE gallium nitride layer was grown on a sapphire substrate, followed by deposition of a 2 micron thick silicon dioxide layer patterned into stripes. A 20 micron thick gallium nitride layer then was grown by MOVPE using ELOG technique to cover the silicon dioxide pattern and achieve a flat gallium nitride surface. This was followed by hydride vapor phase epitaxy (HVPE) to form a gallium nitride layer of about 100 microns thickness. Next, the sapphire substrate was removed by polishing to obtain a gallium nitride article of about 80 microns thickness. Finally, an InGaN MQW LD structure was grown by MOVPE.

Ogawa et al. U.S. Pat. No. 6,455,877 discloses growth of light emitting devices on gallium nitride substrate formed by HYPE deposition of gallium nitride on ELOG gallium nitride formed by MOVPE on sapphire, wherein the sapphire was polished away after formation of sufficient gallium nitride thickness. Ogawa et al. describes a preferred substrate orientation of 0.10 to 0.25 degree tilt away from the c-plane of the gallium nitride material. In subsequent U.S. Published Patent Application No. 2001/0030329, Ueta, et al. state a preference for a substrate orientation of 0.05-2 degrees tilted away from the c-plane of the gallium nitride material. In these various device structures, the device layer was grown by MOVPE directly on the as-grown HYPE gallium nitride surface.

U.S. Patent Publication No. 20050104162 discloses a GaN substrate including a GaN (0001) surface off-cut from the (0001) plane predominantly towards a direction selected from the group consisting of <10$\bar{1}$0> and <11$\bar{2}$0> directions and methods for making the same. GaN substrates with surfaces intentionally tilted away from the lattice c-plane (0001), i.e., wafers with vicinal c-plane surface or with off-cut surfaces, exhibit surface lattice step structures. Furthermore, the intentionally tilted surfaces of GaN substrates allow homoepitaxial growth to be carried out which produces high quality smooth homoepitaxial films of GaN.

As known to those familiar with photonic devices such as LEDs and lasers, the frequency of electromagnetic radiation (i.e., the photons) that can be produced by a given semiconductor material is related to the material's bandgap. Smaller bandgaps produce lower energy, longer wavelength photons, while wider bandgap materials produce higher energy, shorter wavelength photons. For example, one semiconductor commonly used for lasers is aluminum indium gallium phosphide (AlInGaP). Because of this material's bandgap (actually a range of bandgaps depending upon the mole or atomic fraction of each element present), the light that AlInGaP can produce may be limited to the red portion of the visible spectrum, i.e., about 600 to 700 nanometers (nm). In order to produce photons that have wavelengths in the blue or ultraviolet portions of the spectrum, semiconductor materials having relatively large bandgaps may be used. Group III-nitride materials such as gallium nitride (GaN), the ternary alloys indium gallium nitride (InGaN), aluminum gallium nitride (AlGaN) and aluminum indium nitride (AlInN) as well as the quaternary alloy aluminum gallium indium nitride (AlInGaN) are attractive candidate materials for blue and UV lasers because of their relatively high bandgap (3.36 eV at room temperature for GaN). Accordingly, Group III-nitride based laser diodes have been demonstrated that emit light in the 370-420 nm range. Published U.S. Application Nos. 20040152224, 20040147094, 20040147054, and 20040149997 describe various methods and structures for gallium-nitride based laser devices.

The contents of all of the foregoing patents, patent applications and published patent applications are incorporated entirely herein by reference as if fully set forth herein.

SUMMARY

The present invention relates generally to semiconductor devices and in a particular aspect relates to the directional placement of a laser diode on an off-axis or off-cut substrate.

In one aspect, the invention relates to a III-V nitride substrate having an (Al,Ga,In)N off-cut surface with a plurality of parallel steps, each step of the plurality of parallel steps having a first step face and a second step face meeting along a crest, wherein each first step face and each second step face is orthogonal to a cleavage plane.

In another aspect, the invention relates to a III-V nitride substrate including a III-V nitride (0001) surface off-cut from the <0001> direction predominantly towards the <11$\bar{2}$0>direction and including a substrate flat, wherein the substrate flat has a flat tolerance of less than 5 degrees of azimuthal orientation.

In another aspect, the invention relates to a semiconductor device comprising: a GaN substrate including a GaN (0001) surface off-cut from the <0001> direction predominantly towards the <11$\bar{2}$0> direction; and a laser diode cavity on the GaN substrate oriented parallel to the <1$\bar{1}$00> direction.

In another aspect, the invention relates to a GaN substrate including a GaN (0001) surface off-cut from the <0001> direction predominantly towards the <11$\bar{2}$0> direction and further comprising a substrate flat that defines the cleavage plane orthogonal to the <1$\bar{1}$00>direction.

In yet another aspect, the invention relates to a laser diode comprising a GaN substrate including a GaN (0001) surface off-cut from the <0001> direction predominantly towards the <11$\bar{2}$0> direction; and a laser diode cavity on the GaN substrate oriented parallel to the <1$\bar{1}$00> direction.

A still further aspect of the invention relates to a microelectronic device structure including a GaN substrate including a GaN (0001) surface off-cut from the <0001> direction predominantly towards the <11$\bar{2}$0> direction; and a facet oriented on a cleavage plane orthogonal to the <1$\bar{1}$00> direction.

In another aspect, the invention relates to a semiconductor device comprising: a GaN substrate including a GaN (0001) surface off-cut from the <0001> direction predominantly towards the <1$\bar{1}$00> direction: a laser diode cavity on the GaN substrate oriented parallel to the <11$\bar{2}$0> direction; and a laser facet oriented on a cleavage plane parallel to the <1$\bar{1}$00> direction.

A still further aspect of the invention relates to a semiconductor device comprising: a III-V nitride substrate including a (Al,Ga,In)N (0001) surface off-cut from the <0001> direction predominantly towards the <11$\bar{2}$0> direction; and a laser diode cavity on the III-V nitride substrate oriented parallel to the <1$\bar{1}$00> direction.

Another aspect of the invention relates to a laser diode including a semiconductor device as described above, including epitaxial layers grown on said substrate by hydride vapor phase epitaxy.

A further aspect of the invention relates to a laser diode including a semiconductor device as described hereinabove, as fabricated by a fabrication method including processing steps selected from the group consisting of patterning, etching, deposition and facet cleaving.

In yet another aspect, the invention relates to a microelectronic device oriented on a III-V nitride substrate wherein the III-V nitride substrate includes a III-V nitride (0001) surface off-cut from the <0001> direction predominantly towards the <11$\bar{2}$0> direction.

Another aspect of the inventor relates to a microelectronic device oriented on a III-V nitride substrate, wherein the III-V nitride substrate includes a III-V nitride (0001) surface off-cut from the <0001> direction predominantly towards the <1$\bar{1}$00> direction.

Other aspects, features and embodiments of the invention will be more fully apparent from the ensuing disclosure and appended claims.

BRIEF DESCRIPTION OF THE DRAWINGS

FIGS. 3A-3D illustrate a laser diode orientations on vicinal GaN substrates, according to additional embodiments of the invention.

DETAILED DESCRIPTION

Figure 1:
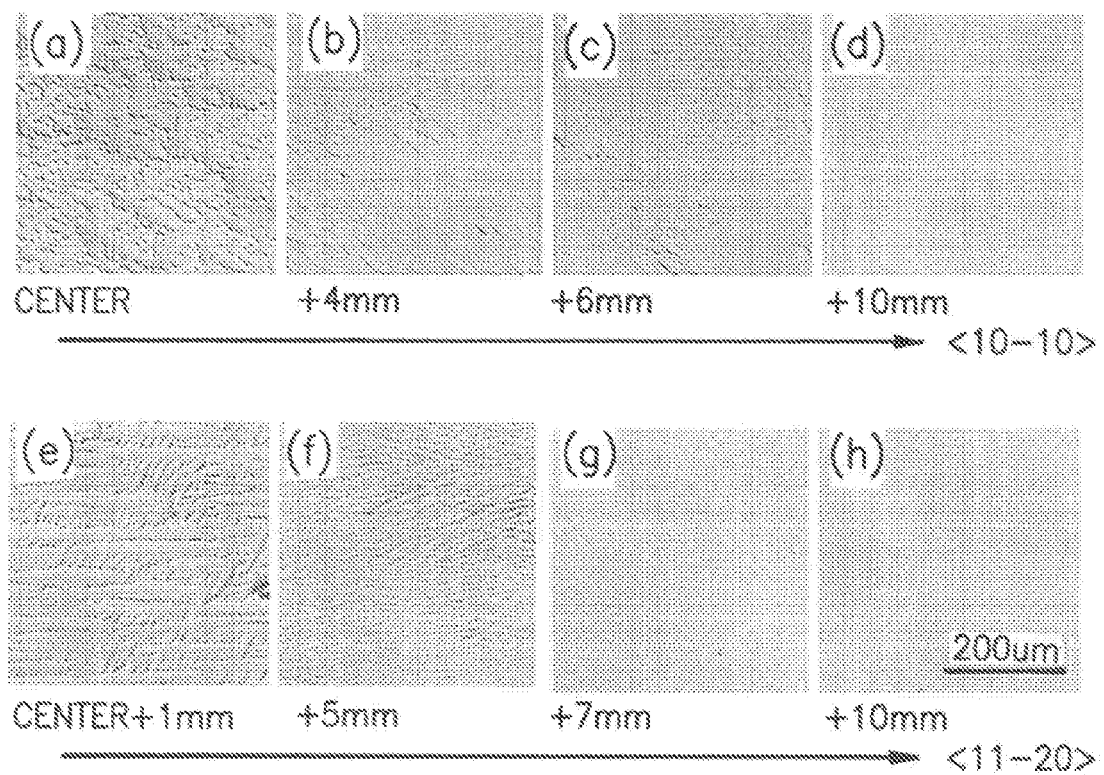
FIG. 1 is a series of a micrographs of a GaN epitaxial layer grown on a wafer in which the crystallographic orientation changes smoothly as a function of distance from the wafer center, wherein the wafer center is [0001] (micrograph (a)), with micrographs (b), (c) and (d) being at distances of 4 mm, 6 mm and 10 mm from the center along the <10$\bar{1}$0> direction; in the micrographs (e), (f), (g) and (h), the wafer center +1 mm is shown in micrograph (e), and with micrographs (f), (g) and (h) being at distances of 5 mm, 7 mm and 10 mm from the center along the <11$\bar{2}$0> direction.

Although the ensuing discussion herein is directed primarily to GaN as an illustrative III-V nitride species for application of the present invention, it will be recognized that the invention is broadly applicable to III-V nitride compounds, including binary compounds and alloys.

As used herein, the term "III-V nitride" refers to semiconductor material including nitrogen and at least one of Al, In and Ga. Such III-V nitride material may be denoted symbolically as (Al,In,Ga)N. The term "(Al,In,Ga)N" includes all permutations of nitrides including one or more of Al, In and Ga, and thus encompasses as alternative materials AN, InN, GaN, AlInN, AlGaN, InGaN and AlInGaN, wherein the stoichiometric coefficients of Al, In, and Ga in compounds containing two, or all three, of such metals may have any appropriate values between 0 and 1 with the proviso that the sum of all such stoichiometric coefficients is 1. In this respect, impurities such as hydrogen or carbon, dopants, or strain-altering materials such as boron can also be incorporated in the (Al, In,Ga)N material, but the sum of all stoichiometric coefficients is 1 within a variation of +0.1%. Examples of such compounds include $Al_xGa_{1-x}N$ wherein $0 \leq x \leq 1$, and $Al_x In_yGa_{1-x-y}N$ wherein $0 \leq x \leq 1$ and $0 \leq y \leq 1$. Thus, although the ensuing discussion is directed to GaN as an illustrative material, other III-V nitride materials may likewise be employed in the substrates and devices of the invention.

By way of reference, the c-plane of the GaN crystal is designated as (0001) plane, and the direction of the c-plane is the c-axis [0001] direction. When reference is made to (0001) plane, the gallium-terminated c-plane is meant, whereas the (000$\bar{1}$) plane refers to the nitrogen-terminated c-plane. The direction of a surface or plane is defined as the direction normal to the surface. When the surface direction of a vicinal wafer is the plane defined by <0001> and <11$\bar{2}$0> directions, the surface is referred to as a (0001) surface off-cut towards the <11$\bar{2}$0> direction. Because of the symmetry of the GaN crystal, the <10$\bar{1}$0> direction is a general expression of a group of directions including [10$\bar{1}$0], [$\bar{1}$010], [1$\bar{1}$00], [$\bar{1}$100], [01$\bar{1}$0] and [0$\bar{1}$10]. The <11$\bar{2}$0> direction is a general expression of a group of directions including [11$\bar{2}$0], [$\bar{1}\bar{1}$20], [1$\bar{2}$10], [$\bar{1}$2$\bar{1}$0], [$\bar{2}$110] and [2$\bar{1}\bar{1}$0]. As used herein, the term "predominantly towards" in reference to a specified direction, e.g., the <10$\bar{1}$0> direction or the <11$\bar{2}$0> direction, means towards such direction ±15 degrees. It should be borne in mind that such reference refers to an azimuthal tolerance angle, in contrast to reference herein to a polar (off-cut) angle. Preferably, the azimuthal variation towards the specified direction is ±5 degrees, and most preferably, such variation is ±2 degrees.

The present invention reflects the discovery that GaN substrates with surfaces off-cut from the (0001) plane predominantly towards a direction selected from the group consisting of <10$\bar{1}$0> and <11$\bar{2}$0> directions exhibit lattice surface steps on the substrate due to the tilting of the substrate lattice structure. Epitaxial films grown on these off-cut surfaces have a smoother morphology than substrate surfaces that are not tilted away from the (0001) plane.

In one illustrative aspect, the present invention relates to a laser diode oriented on a GaN substrate wherein the GaN substrate includes a GaN (0001) surface off-cut from the <0001> direction predominantly towards the <11$\bar{2}$0> direction. The off-cut angle may range from 0.2 to 10 degrees providing surface lattice steps parallel to the <1$\bar{1}$00> direction. The laser diode cavity may be formed on the off-cut substrate surface such that the laser diode cavity direction is oriented along the <1$\bar{1}$00> direction parallel to the lattice surface steps of the substrate. The preferred cleavage plane is then orthogonal to the <1$\bar{1}$00> direction yielding a cleaved laser facet that is orthogonal to the surface lattice steps of the substrate. In further embodiments of the present invention, the substrate flat is positioned to define the <11$\bar{2}$0> direction of the cleavage plane.

In another illustrative aspect, the present invention relates to a laser diode oriented on a GaN substrate wherein the GaN substrate includes a GaN (0001) surface off-cut from the <0001> direction predominantly towards the <1$\bar{1}$00> direction. The off-cut angle may range from 0.2 to 10 degrees providing surface lattice steps parallel to the <$\bar{1}\bar{1}$20>—more commonly <11$\bar{2}$0> direction. The laser diode cavity may be formed on the off-cut substrate surface such that the laser diode cavity direction is oriented along the <1$\bar{1}$00> direction orthogonal to the lattice surface steps of the substrate. The preferred cleavage plane is orthogonal to the <1$\bar{1}$00> direction yielding a cleaved laser facet that contains the c-axis vector. In further embodiments of the present invention, the substrate flat is positioned to define the <1$\bar{1}$00> direction of the cleavage plane.

The invention has broad applicability to a wide variety of microelectronic device assemblies, and structures. A preferred device application is laser diodes, and laser diode structures of the present invention at potential utility in flow cytometry, printing, spectroscopy and medical systems applications.

FIG. 1 shows differential interference contrast (DIC) microscope images of epitaxial layers grown on different GaN surfaces, i.e., surfaces with different mis-cut directions and mis-cut angles.

GaN substrates were prepared by hydride vapor phase epitaxy. In order to investigate the effect of surface orientation on homoepitaxy, a 30 mm diameter GaN wafer with large lattice curvature and wafer bow was produced. Mechanical lapping and polishing eliminated the physical wafer bow, but the lattice curvature remained, resulting in a surface with varying degrees of off-cut with respect to the c-plane.

FIG. 1 shows a series of a micrographs of a GaN epitaxial layer grown on the resulting wafer, in which the crystallographic orientation changes smoothly as a function of distance from the wafer center, wherein the wafer center is [0001] (micrograph (a)), with micrographs (b), (c) and (d) being at distances of 4 mm, 6 mm and 10 mm from the center along the <10$\bar{1}$0> direction; in the micrographs (e), (f), (g) and (h), the wafer center +1 mm is shown in micrograph (e), and with micrographs (f), (g) and (h) being at distances of 5 mm, 7 mm and 10 mm from the center along the <11$\bar{2}$0> direction.

Homoepitaxial growth was carried out in an Aixtron 200/4 MOVPE system using trimethylgallium, ammonia precursors and hydrogen carrier gas. The growth temperature was 1170° C., as monitored with a thermocouple placed behind the susceptor, and the growth pressure was 100 mbar. The growth rate was 2 μm per hour, and the V:III ratio was 6000:1, producing a 3 μm homoepitaxial GaN film on the gallium surface of the vicinal substrates.

FIG. 1 thus shows surface images of the substrate center, and surfaces mis-cut by 0.4°, 0.6°, and 1.0° towards the <10$\bar{1}$022 direction, and surfaces mis-cut by 0.1°, 0.5°, 0.7° and 1.0° towards the <11$\bar{2}$0> direction. In the (nominally c-plane) center of the wafer, the surface exhibited six-fold hillock structure, as shown in micrograph (a). Away from the center, one side of the hillock became gradually elongated, as shown in micrograph (e), and the surface became smoother. The evolution of the morphology along the <10$\bar{1}$0> direction and along the <11$\bar{2}$0>direction, was slightly different, but at a distance of 10 mm from the center, the surface morphology observed under the DIC microscope was featureless.

The surface morphology of the epitaxial film in the FIG. 1 micrographs becomes increasingly smooth in each direction as the off-cut, or tilt angle approaches 1 degree. Smooth surface epitaxial films are desirable surfaces for various semiconductor devices such as laser diodes. Therefore, substrates may be intentionally off-cut along the <10$\bar{1}$0> and <11$\bar{2}$0>directions for use in such device applications.

Figure 2A:
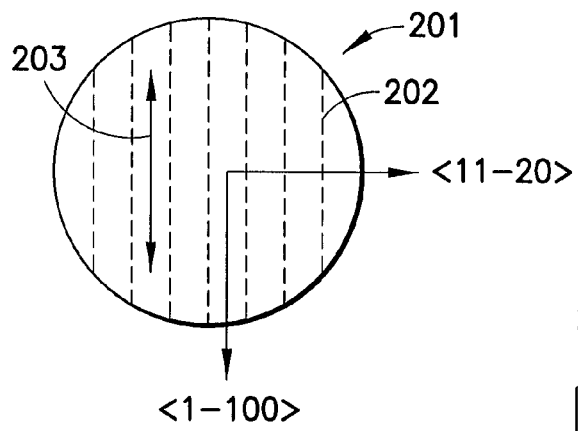
FIGS. 2A-2D illustrate laser diode orientations on vicinal GaN substrates according to various embodiments of the invention.
Figure 2B:
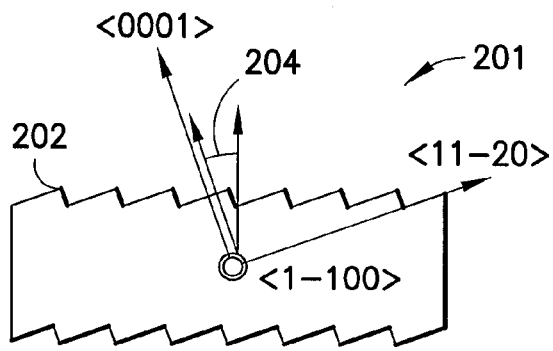

Various embodiments of the present invention in which GaN substrates are off-cut towards the <11$\bar{2}$0> direction are schematically illustrated in FIG. 2A-2D. FIG. 2A represents a top plan view of the surface of an off-cut substrate 201 towards the <11$\bar{2}$0> direction. The illustrative lattice surface steps 202 are shown orthogonal to the <11$\bar{2}$0> direction as a result of the lattice structure being tilted towards the <11$\bar{2}$0> direction. A laser diode cavity direction 203, that is defined as the lengthwise direction of the laser cavity, may be oriented along the <1$\bar{1}$00> direction parallel to the lattice surface steps 202 of the substrate. FIG. 2B represents a cross-sectional view of the substrate off-cut towards the <11$\bar{2}$0> direction 201, the view being along the <1$\bar{1}$00> direction. The angle of tilt 204 from the <0001> direction along the <11$\bar{2}$0>direction may be in a range of 0.2 to 10 degrees and determines the orientation of the lattice surface steps 202.

Figure 2C:
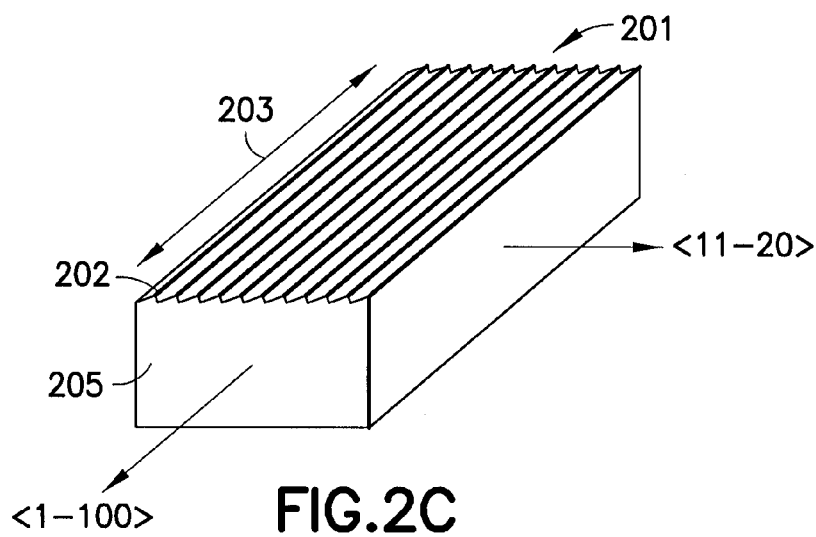

For laser diode applications, it may be desirable to have a cleaved facet that is orthogonal to the laser diode cavity in order to achieve improved power performance. Referring now to FIG. 2C, the laser diode cavity direction 203 is shown parallel to the lattice surface steps 202 along the <1$\bar{1}$00> direction. For a cleaved facet 205 that is orthogonal to the laser diode cavity direction 203, the preferred cleavage plane is orthogonal to the <1$\bar{1}$00> and the lattice surface steps 202.

Figure 2D:
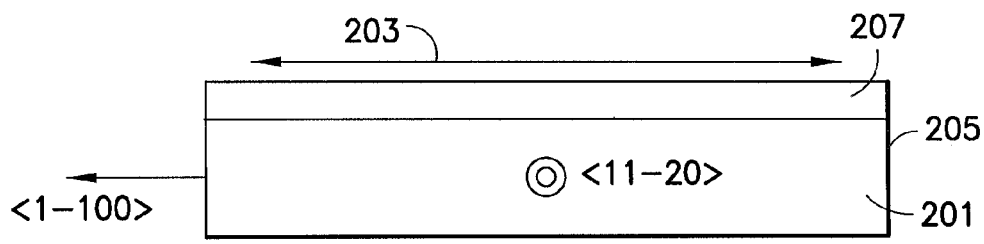

FIG. 2D represents a side view of the <11$\bar{2}$0> off-cut substrate 201 that further includes a laser diode cavity 207 aligned in the laser diode cavity direction 203 of the <1$\bar{1}$00>crystal direction. The cleaved facet 205 is then orthogonal to the laser diode cavity 207.

Additional embodiments of the present invention, wherein GaN substrates are off-cut along the <1$\bar{1}$00> direction, are schematically illustrated in FIGS. 3A-3D. FIG. 3A represents a top view of the surface of an off-cut substrate 301 along the <1$\bar{1}$00> direction. Lattice surface steps 302 are shown orthogonal to the off-cut direction <1$\bar{1}$00> as a result of the lattice structure being tilted towards the <1$\bar{1}$00> direction. A laser diode cavity direction 303 may be oriented along the <1$\bar{1}$00> direction orthogonal to the lattice surface steps 302 of the substrate. FIG. 3B represents a cross-sectional view of the <1$\bar{1}$00> off-cut substrate 301, the view being along the <$\bar{1}$$\bar{1}$20> direction. The angle of tilt 304 from the <0001> direction along the <1$\bar{1}$00> direction may be in a range of 0.2 to 10 degrees and determines the orientation of the lattice surface steps 302.

Referring now to FIG. 3C, the laser diode cavity direction 303 is shown along the <1$\bar{1}$00>orthogonal to the lattice surface steps 302. For a cleaved facet 305 that is desired to be orthogonal to the laser diode cavity direction 303, the preferred cleavage plane is orthogonal to the <1$\bar{1}$00> direction and parallel to the lattice surface steps 302. Referring back to FIG. 3B, a preferred cleavage plane 307 is orthogonal to the laser diode cavity direction 303 and will align with the lattice surface steps 302 and be angled or tilted compared to the laser diode cavity direction 303.

FIG. 3D represents a side view of the <1$\bar{1}$00> off-cut substrate 301 that further comprises a laser diode cavity 307 aligned in the laser diode cavity direction 303 of the <1$\bar{1}$00>crystal direction. The cleaved facet 305 is then tilted or angled compared to the laser diode cavity 307.

As shown in the previous figures, it is preferable to orient a laser diode cavity so that a cleavage plane of the substrate determines its facets. It is also preferable to align the substrate flat to define the desired cleavage plane. For a well-defined laser facet, the substrate flat tolerance, or angular orientation, is therefore preferably known to within 5 degrees, more preferably within 1 degree, still more preferably within 0.1 degree and most preferably to within 0.01 degree. Given the desirability of well-oriented cleavage and wafer flat, it is desirable to use appropriate cleaving techniques to form or define the wafer flat.

While both orientations yield working laser diodes, the first embodiment illustrated by FIGS. 2A-2D enables both smooth epitaxy due to the vicinal wafer surface and facets orthogonal to the laser diode cavity. Such configuration is preferred in various embodiments of the invention, since an orthogonal facet is useful to achieve improved power performance (efficiency and $P_{out}$).

In various embodiments, the epitaxial films grown on the off-cut substrate may be dealt with suitable dopants of a type conventionally employed for doping of GaN and other III-V nitride films. In one embodiment, silicon doping of GaN is effected by adding silane during the homoepitaxial growth process, to produce an epitaxial film on the vicinal surface that is smooth and featureless.

While the invention has been variously described herein, in reference to illustrative examples, aspects, features and embodiments, it will be recognized that the invention is not thus limited, but rather is of a character that may be implemented in various alternative forms and embodiments, such as will suggest themselves to those of ordinary skill in the art, based on the disclosure herein. Accordingly, the invention is intended to be broadly construed, as encompassing all such alternative forms and embodiments, within the scope of the claims hereinafter set forth.

What is claimed is:

1. A III-V nitride substrate having an (Al,Ga,In)N off-cut surface with a plurality of parallel steps, each step of the plurality of parallel steps having a first step face and a second step face meeting along a crest, wherein each first step face and each second step face is orthogonal to a cleavage plane, and wherein the off-cut surface is off-cut from a <0001>direction and has a tilt direction oriented to within ±15 degrees of the <11$\bar{2}$0> direction.

2. The III-V nitride substrate of claim 1, wherein the <11$\bar{2}$0>direction includes the [11$\bar{2}$0] direction.

3. The III-V nitride substrate of claim 1, wherein the off-cut surface has an off-cut angle in a range of from 0.2 to 10 degrees.

4. The III-V nitride substrate of claim 1, wherein the substrate is cleaved along the cleavage plane.

5. The III-V nitride substrate of claim 1, comprising a substrate flat disposed substantially parallel to the cleavage plane.

6. The III-V nitride substrate of claim 1, comprising a substrate flat having a flat tolerance of less than 5 degrees of azimuthal orientation.

7. The III-V nitride substrate of claim 1, comprising a facet oriented on the cleavage plane.

8. The III-V nitride substrate of claim 1, wherein the III-V nitride substrate is a GaN substrate.

9. The III-V nitride substrate of claim 1, comprising a laser diode cavity disposed parallel to each first step face and each second step face.

10. The III-V nitride substrate of claim 9, further comprising at least one facet, wherein the laser diode cavity is substantially orthogonal to the at least one facet.

11. An electronic device comprising the III-V nitride substrate of claim 1, comprising any of an optoelectronic device, a microelectronic device, and a semiconductor device.

12. The electronic device of claim 11, further comprising epitaxial layers grown on or over at least a portion of the III-V nitride substrate.

13. The electronic device of claim 11, comprising a vertical device.

14. A III-V nitride substrate including a III-V nitride (0001) surface off-cut from a <0001> direction predominantly towards a <11$\bar{2}$0> direction and including a substrate flat, wherein the substrate flat has a flat tolerance of less than 5 degrees of azimuthal orientation.

15. The III-V nitride substrate of claim 14, wherein the <11$\bar{2}$0> direction includes the [11$\bar{2}$0] direction.

16. The III-V nitride substrate of claim 14, wherein the substrate flat has a flat tolerance of less than 1 degree of azimuthal orientation.

17. The III-V nitride substrate of claim 14, wherein the substrate flat defines a cleavage plane.

18. The III-V nitride substrate of claim 14, wherein the surface off-cut from the <0001> direction predominantly towards the <11$\bar{2}$0> direction has an off-cut surface angle in a range of from about 0.2 to about 10 degrees.

19. The III-V nitride substrate of claim 14, wherein the surface off-cut from the <0001> direction predominantly towards the <11$\bar{2}$0> direction has a tilt direction that is oriented to within ±15 degrees of the <11$\bar{2}$0> direction.

20. The III-V nitride substrate of claim 14, wherein the surface off-cut from the <0001> direction predominantly towards the <11$\bar{2}$0> direction has a tilt direction that is oriented to within ±5 degrees of the <11$\bar{2}$0> direction.

21. The III-V nitride substrate of claim 14, wherein the III-V nitride substrate is a GaN substrate.

22. An electronic device comprising the III-V nitride substrate of claim 14, comprising any of an optoelectronic device, a microelectronic device, and a semiconductor device.

23. The electronic device of claim 22, further comprising epitaxial layers grown on or over at least a portion of the III-V nitride substrate.

24. The electronic device of claim 22, wherein the substrate flat is disposed substantially parallel to a cleavage plane of the substrate.

25. The electronic device of claim 22, wherein the substrate is cleaved along the cleavage plane.

26. The electronic device of claim 22, comprising a vertical device.

27. The electronic device of claim 22, comprising a facet oriented on the cleavage plane.

28. The electronic device of claim 22, comprising a laser diode cavity on the substrate oriented parallel to the <1$\bar{1}$00> direction.

29. A III-V nitride substrate having an (Al,Ga,In)N off-cut surface with a plurality of parallel steps, each step of the plurality of parallel steps having a first step face and a second step face meeting along a crest, wherein each first step face and each second step face is orthogonal to a cleavage plane, and wherein parallel steps of the plurality of parallel steps are disposed parallel to a <11$\bar{2}$0> direction.

\* \* \* \* \*